(12) United States Patent
Ge et al.

(10) Patent No.: US 8,504,966 B2
(45) Date of Patent: Aug. 6, 2013

(54) METHOD AND DEVICE FOR REORDERING SCAN CHAINS CONSIDERING PLAN GROUPS

(75) Inventors: Kunfeng Ge, Shanghai (CN); Bang Liu, Shanghai (CN)

(73) Assignee: Synopsys (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/504,051

(22) PCT Filed: Oct. 27, 2010

(86) PCT No.: PCT/IB2010/002736
§ 371 (c)(1),
(2), (4) Date: Apr. 25, 2012

(87) PCT Pub. No.: WO2011/051784
PCT Pub. Date: May 5, 2011

(65) Prior Publication Data
US 2012/0240092 A1    Sep. 20, 2012

(30) Foreign Application Priority Data

Oct. 30, 2009 (CN) .......................... 2009 1 0211374

(51) Int. Cl.
*G06F 17/50* (2006.01)
(52) U.S. Cl.
USPC .......................................... 716/119; 716/114
(58) Field of Classification Search
USPC .................................. 716/118–125, 114–115
See application file for complete search history.

(56) References Cited

U.S. PATENT DOCUMENTS 7,757,198 B1 * 7/2010 Zhao et al. ..................... 716/103
2006/0265683 A1 * 11/2006 Osanai ............................ 716/10

OTHER PUBLICATIONS

Notification of Transmittal, dated May 10, 2012, of Translation of the International Preliminary Report on Patentability and the Written Opinion of the International Searching Authority from the corresponding International Application No. PCT/IB2010/002736.

* cited by examiner

*Primary Examiner* — Binh Tat
(74) *Attorney, Agent, or Firm* — Young, Basile, Hanlon & MacFarlane, P.C.

(57) ABSTRACT

Reconfiguration methods and devices are disclosed for scan chains with the planned unit taken into consideration, the one method comprising a first phase reconfiguration and second phase reconfiguration. The first phase reconfiguration first classifies a number of scan chains, wherein scan chains with the starting point and the ending point in the same planned unit are classified as a first aggregation of scan chains; scan chains with the starting point and the ending point not in the same planned unit are classified as a second aggregation of scan chains; and scan chains with both the starting point and the ending point at the same top level are classified as a third aggregation of scan chains. In sequence the scan chains within the first aggregation are reconfigured, then the scan chains within the second aggregation are reconfigured, and finally the scan chains within the third aggregation are reconfigured.

12 Claims, 8 Drawing Sheets

METHOD AND DEVICE FOR REORDERING SCAN CHAINS CONSIDERING PLAN GROUPS

TECHNICAL FIELD

The present relates to a reconfiguration method and device for scan chains, particularly to a reconfiguration method and device for scan chains during the module design planning phase for a chip.

BACKGROUND

During module design planning of a chip comprising a test chain, arbitrary distribution of the scan components will cause too many connection wires to be present between various planned units. Meanwhile, each planned unit also needs to create more terminals for input and output of scan signals. As a result, each planned unit has a very large demand for resources during application at the top level, thus enhancing the difficulty in design. In order to reduce the number of ports on the planned units and connection wires between the units caused by the scan chain going through the planned unit, it is necessary to reconfigure the scan chain, that is, to adjust the position of the scan components to form a new scan chain.

FIG. 1 is a reconfiguration method of a scan chain: First in Step 70, the starting point of said scan chain serves as a reference component, and in Step 71, the distance of said reference component to all other available scan components in said scan chain is calculated, to determine the scan component closest to it; in Step 72, said reference component and said scan component closest to it are connected; in Step 73, said scan component closest to it serves as a reference component; and in Step 74, if said reference component is the last available scan component is checked; if yes, then in Step 75 it is connected to the ending point of the scan chain; otherwise, the process goes back to Step 71.

Said reconfiguration method for scan chains only considers the relationship between scan components in terms of distance, without considering information of the position of the planned unit where each scan component is located, so while the length of the scan chain acquired is shortened, it may go through even more planned units than before reconfiguration, thus resulting in the existence of too many connection wires among planned units. Even though after re-arrangement, the number of ports on the planned units and connection wires between planned units is somewhat reduced, there is still room to further reduce the number of ports and connection wires through reconfiguration of the scan chain.

In view of this, the industry still needs a technical plan of reconfiguration of scan chains to solve the problem of too many ports on the planned units and too many connection wires between planned units.

SUMMARY

Provided in the present invention is a reconfiguration method and device for scan chains with the planned unit taken into consideration, wherein while the length of the scan chains is reduced, each scan chain after reconfiguration goes through as few planned units as possible, so that the total of the ports on the planned units and the connection wires between planned units is minimized.

Provided in the present invention is a reconfiguration method for scan chains, which includes a first phase reconfiguration, and said first phase reconfiguration comprises: Step 1: classification of a number of scan chains, wherein scan chains with the starting point and the ending point in the same planned unit are classified as a first aggregation of scan chains; scan chains with the starting point and the ending point not in the same planned unit are classified as a second aggregation of scan chains; and scan chains with the starting point and the ending point at the same top level are classified as a third aggregation of scan chains; Step 2: reconfiguration of the scan chains in said first aggregation of scan chains until said first aggregation of scan chains is void; Step 3: reconfiguration of the scan chains in said second aggregation of scan chains until said second aggregation of scan chains is void; and Step 4: reconfiguration of the scan chains in said third aggregation of scan chains until said third aggregation of scan chains is void.

Based on an example, said Step 2 further comprises: removing the scan chain requiring the fewest scan components from said first aggregation of scan chains; checking if the quantity of the available scan components in a planned unit where the terminal of said scan chain is located meets the need of said scan chain; if there are enough, assigning the available scan components in said planned unit to said scan chain in accordance with the quantity that said scan chain requires; otherwise, assigning all available scan components in said planned unit to said scan chain, and placing said scan chain in the third aggregation of scan chains. Said Step 3 further comprises: removing the scan chain requiring the fewest scan components from said second aggregation of scan chains; determining if said scan chain has a terminal at said top level; if yes, determining if the quantity of the available scan components in the planned unit where the other terminal of said scan chain is located meets the requirement of said scan chain or not; otherwise, for the two planned units where the two terminals of said scan chain are located, calculating respectively the total of the demand of all of the scan chains from which scan components may be selected for scan components; and determining if the available scan components in meet demand planned units meet the requirement of said scan chain, and if yes, then selecting scan components preferably from a planned unit where the total demand for the scan components is less and assigning them to said scan chain, and selecting scan components from another planned unit for deficiencies; otherwise, assigning all available scan components in meet demand planned units to said scan chain, and placing said scan chain in the third aggregation of scan chains. Said Step 4 further comprises: removing the scan chain requiring the greatest number of scan components from said third aggregation of scan chains; checking if there is a planned unit containing more available scan components than the quantity of scan components required by the scan chain with the greatest demand; if yes, then selecting a scan chain from the planned unit with the fewest scan components; otherwise, begin assigning scan components to said scan chain from said planned unit containing the greatest number of available scan components, and finally selecting scan components from the top level. Said reconfiguration method for scan chains can further comprise a second phase reconfiguration, and during said second phase reconfiguration, the scan components required by the scan chains in the same planned unit will be reassigned based on the positions of the scan components, wherein the adjacent scan components that are close to a scan chain will be assigned to said scan chain.

Provided in the present invention is also a reconfiguration device for scan chains that corresponds to said reconfiguration method for scan chains, which comprises a first stage reconfigurator, and said first stage reconfigurator comprises: a classifier, for classification of scan chains, wherein scan chains with the starting point and the ending point in the same planned unit are classified as a first aggregation of scan chains; scan chains with the starting point and the ending point not in the same planned unit are classified as a second aggregation of scan chains; and scan chains with the starting point and the ending point at the same top level are classified as a third aggregation of scan chains; an assigner, which is communicatively connected to said classifier and which first reconfigures the scan chains in said first aggregation of scan chains until said first aggregation of scan chains is void, then reconfigures the scan chains in said second aggregation of scan chains until said second aggregation of scan chains is void, and finally reconfigures the scan chains in said third aggregation of scan chains until said third aggregation of scan chains is void.

The present invention of the reconfiguration method and device for scan chains not only considers the information of the positions of the scan chains and scan components, but also the information of the position of the starting point and ending point of a scan chain in the planned unit or at the top level, reducing the number of ports on the planned unit and the number of connection wires between planned units to a maximum extent, thus acquiring an even better result of planning the design and reducing the demand for upper resources and the difficulty in subsequent design.

BRIEF DESCRIPTION OF THE DRAWINGS

The various features, advantages and other uses of the present apparatus will become more apparent by referring to the following detailed description and drawing in which.

DETAILED DESCRIPTION

In order to better understand the spirit of the present invention, the following is further description in association with preferred examples of the present invention.

Provided in the present invention is a scan chain reconfiguration method and device based on the planned unit during the chip module design planning phase.

Based on an example of the present invention, the scan chain reconfiguration method based on the planned unit comprises two phases.

First, during the first phase of the scan chain reconfiguration, primarily based on the quantity of scan components in the planned unit, a scan chain is allowed to select scan components from the planned unit with the fewest possible scan components. And in the process of reconfiguration, adequate consideration is given to the relationship between the starting point and ending point of the scan chain and the planned unit, so that the scan components in the same planned unit are given priority for assignment to the scan chain relevant to them, thus reducing the number of possible connection wires between the planned units.

Then, during the second phase of the scan chain reconfiguration, primarily based on the position information of the scan components, assignment of the scan components is conducted within one planned unit to assign the adjacent scan components to the same scan chain, thus reducing the length of wiring between the scan components within each scan chain.

The following is a detailed description of the first phase and second phase of said scan chain reconfiguration, respectively:
First phase reconfiguration.

During the first phase of the scan chain reconfiguration, the sequence of reconfiguration is based on the position of the starting point and ending point of each scan chain, so that whenever possible, the scan chain will not go beyond the planned unit where it is located, wherein the scan chains with the starting point and the ending point in the same planned unit are classified as a first aggregation of scan chains, and scan components will preferably be selected from the planned unit where they are located, the scan chains with the starting point and the ending point not in the same planned unit are classified as a second aggregation of scan chains, to be treated at a lower priority, and the scan chains with both the starting point and ending point at the top level are classified as a third aggregation of scan chains, to be treated last.

Figure 1:
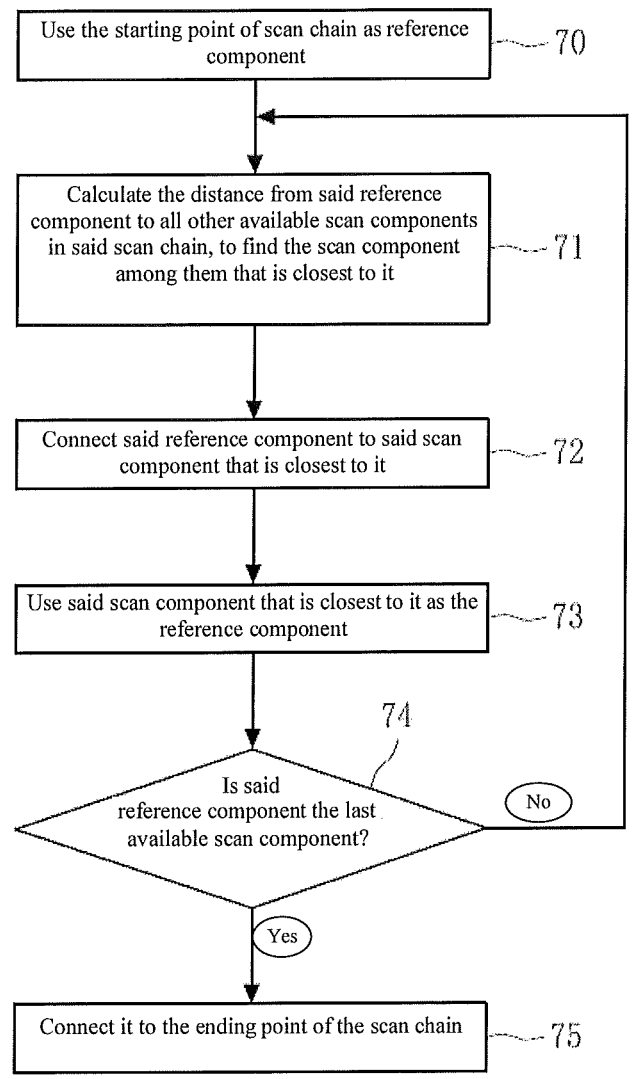
FIG. 1 is a flow chart of scan chain reconfiguration using the distance sequencing method.
Figure 2:
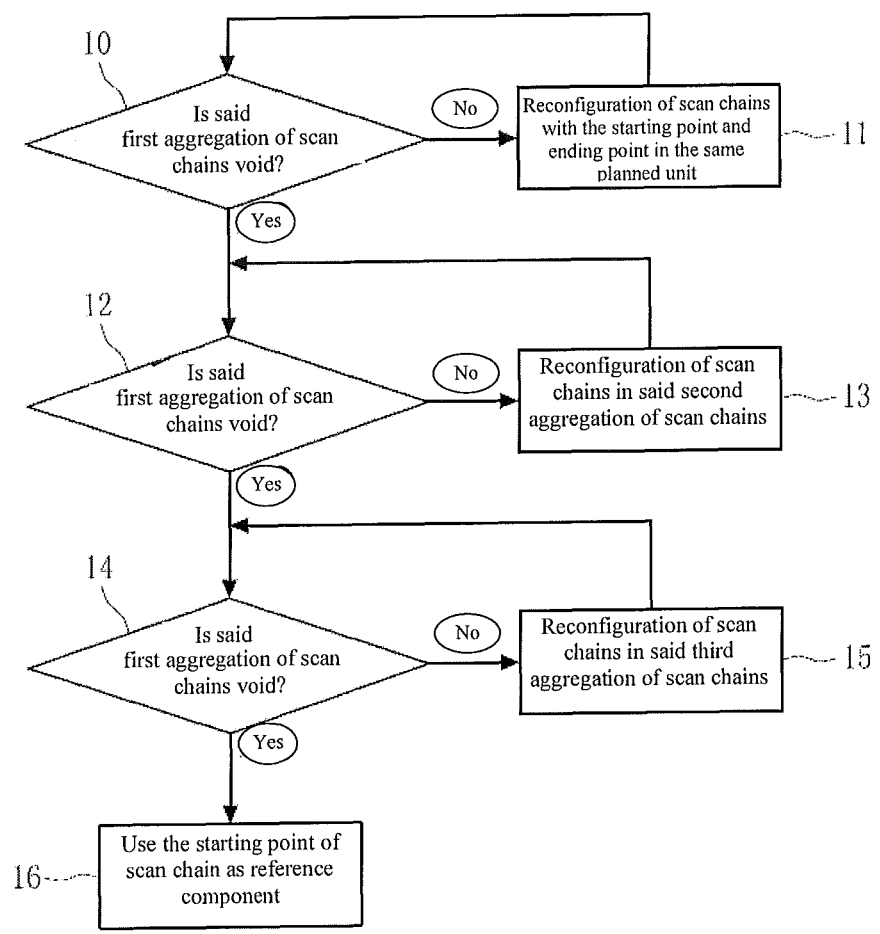
FIG. 2 is a flow chart of the first phase reconfiguration of the present invention.

Specifically, as shown in FIG. 2, first of all, in Step 10, if said first aggregation of scan chains is void is determined, and if there are scan chains with the starting point and the ending point in the same planned unit, then the process goes to Step 11 to reconfigure scan chains with the starting point and the ending point in the same planned unit. Otherwise, in Step 12, if said second aggregation of scan chains is void is determined, and if there are scan chains with the starting point and the ending point not in the same planned unit, or scan chains with only one terminal, that is, with the starting point or the ending point at the top level, then the process goes to Step 13 to reconfigure the scan chains in said second aggregation of scan chains. Otherwise, the process goes to Step 14 to determine if said third aggregation of scan chains is void, and if it is not void, then in Step 15, the scan chains in said third aggregation of scan chains are reconfigured; and if it is void, then the process goes to Step 16 to end said first phase reconfiguration.

Figure 3:
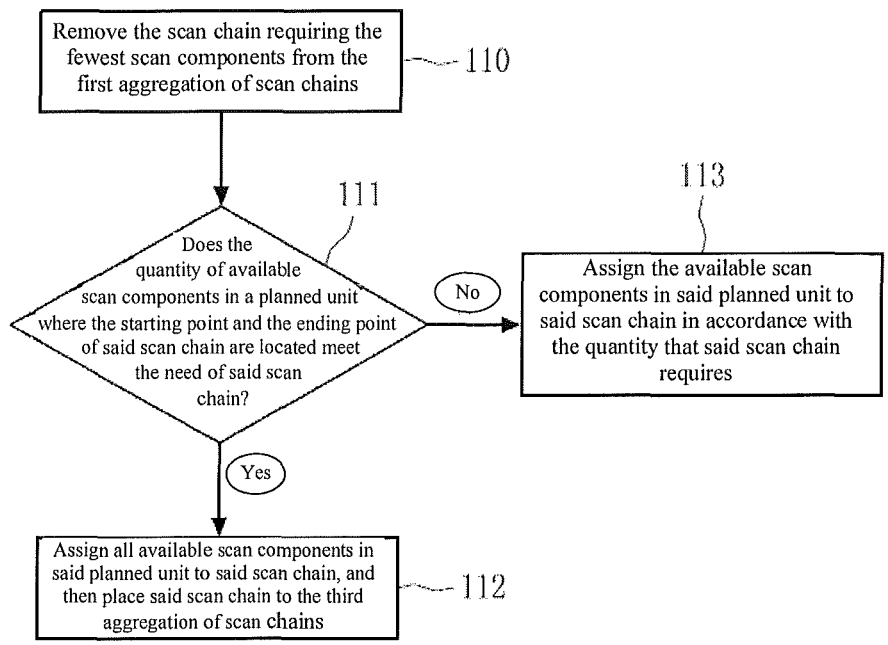
FIG. 3 is a flow chart of reconfiguration of the scan chains in the first aggregation of scan chains during the first phase reconfiguration of the present invention.

As shown in FIG. 3, in Step 11, first beginning with Step 110, the scan chain in the first aggregation of scan chains that requires the fewest scan components is found, and it is removed from the first aggregation of scan chains. In Step 111, if the quantity of the available scan components in the planned unit where the starting point and the ending point of said scan chain are located meets the demand of said scan chain is checked. If yes, in Step 112, based on the quantity demanded, the available scan components in said planned unit are assigned to said scan chain; otherwise, the process goes to Step 113 and all available scan components in said planned unit are assigned to said scan chain and are placed in the third aggregation of scan chains so as to further select scan components in Step 14.

Figure 4:
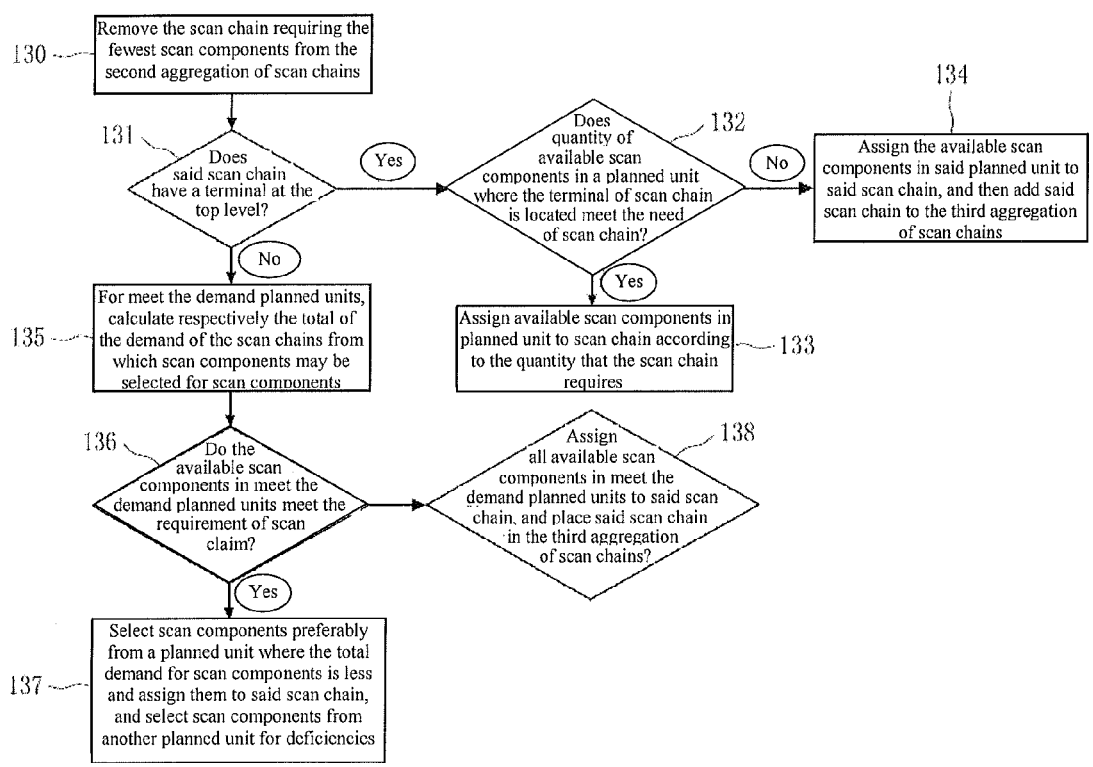
FIG. 4 is a flow chart of reconfiguration of the scan chains in the second aggregation of scan chains during the first phase reconfiguration of the present invention.

As shown in FIG. 4, during reconfiguration of the scan chains in said second aggregation of scan chains, in order for a scan chain to go beyond the planned unit as little as possible, in Step 130, similarly, the scan chain that requires the fewest scan components in the second aggregation of scan chains is found, and it is removed from the second aggregation of scan chains. In Step 131, if said scan chain has one terminal (starting point or ending point) at the top level is checked, and if yes, then the process goes to Step 132 and if the quantity of the scan components in the planned unit where the other end (ending point or starting point) is located meets the demand of said scan chain is determined, and if there are sufficient scan components in said planned unit, then the process goes to Step 133 and the scan components in said planned unit are assigned to said scan chain based on the quantity demanded; otherwise, the process goes to Step 134 and the scan components in said planned unit are assigned to said scan chain and are placed in the third aggregation of scan chains. Otherwise, [if] the starting point and the ending point of said scan chain are in two different planned units, then the process goes to Step 135, for meet demand planned units, the total of the demand of the scan chains from which scan components may be selected for scan components is respectively calculated. In Step 136, if the available scan components in meet demand planned units meet the requirement of said scan chain is determined, and if yes, then in Step 137 scan components are preferably selected from a planned unit where the total demand for the scan components is less and are assigned to said scan chain, and scan components are selected from another planned unit for deficiencies; otherwise, the process goes to Step 138 and available scan components in meet demand planned units are assigned to said scan chain and said scan chain is placed in the third aggregation of scan chains.

Figure 5:
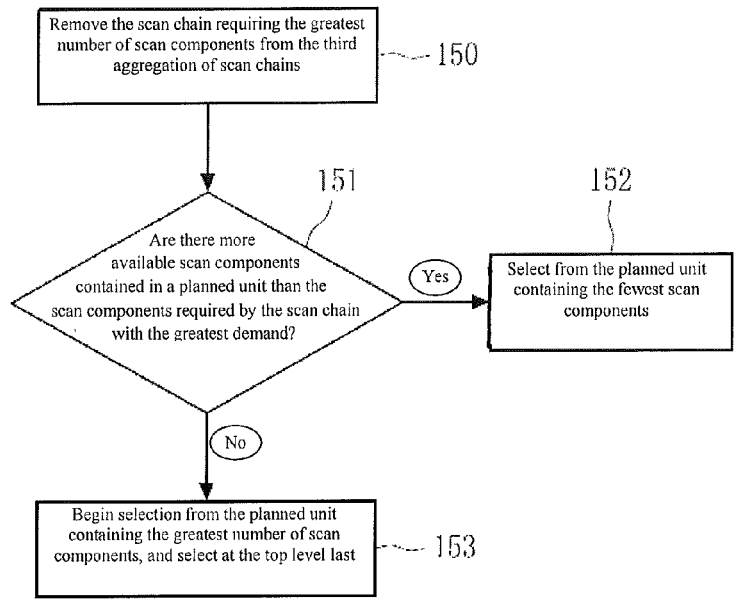
FIG. 5 is a flow chart of reconfiguration of the scan chains in the third aggregation of scan chains during the first phase reconfiguration of the present invention.

As shown in FIG. 5, in Step 15, scan chains with both the starting point and the ending point at the top level are reconfigured and [reconfiguration of] the scan chains the reconfiguration of which is not completed in previous Steps 10 and 11 is completed. In Step 150, the scan chain requiring the greatest number of scan components is removed from said third aggregation of scan chains. In Step 151, if there is a planned unit containing more available scan components than the quantity of scan components required by the scan chain with the greatest demand is checked; if yes, then in Step 152, said scan chain is selected from the planned unit with the fewest scan components; otherwise, in Step 153, selection of said scan chain begins from the planned unit containing the greatest number of available scan components, and finally from the top level, thus avoiding dividing the planned unit by even more scan chains, and reducing the number of ports on said planned unit.

The second phase reconfiguration: Because during the first phase reconfiguration of a scan chain, the scan components in the planned unit are selected randomly for the scan chain, it is possible that a selected scan component may be far from it, while a component very close to it may not be selected. Therefore, during the second phase reconfiguration, the scan components in the same planned unit required by the scan chain are re-assigned based on the positions of the scan components. Of them, adjacent scan components that are close to a scan chain will be assigned to said scan chain, thus reducing the total length of wiring among scan components in said scan chain.

After completion of the two phase reconfiguration mentioned above, the scan components of each scan chain are resequenced, so that the total number of wirings of the scan chain is minimized.

Figure 6:
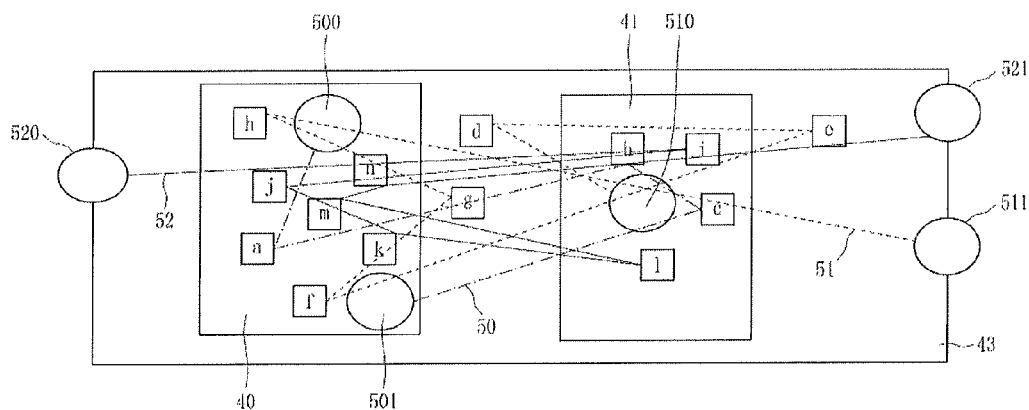
FIG. 6 is a schematic diagram of a scan chain of a chip after it is designed but before it is optimized.

As shown in FIG. 6, in accordance with an example of the present invention, three scan chains 50, 51, and 52 located in two planned units 40 and 41 and at the top level 42 will be reconfigured. The first planned unit 40 comprises seven scan components, which are a, f, j, h, k, m, and n; the second planned unit comprises four scan components, which are b, c, i, and l, while set at the top level are three scan components d, e, and g. The information of the structure of said three scan chains 50, 51, and 52 is respectively [as follows].

The scan chain 50 comprises a total of three scan components a, b, and c, and its starting point 500 and ending point 501 are both in the first planned unit 40, thus forming two cross wires and four ports between the two planned units 40 and 41;

The scan chain 51 comprises a total of five scan components d, e, f, g, and h, and its staring point 510 is in the second planned unit 41, while its ending point 511 is at the top level 42, thus forming three cross wires and five ports between the two planned units 40 and 41;

The scan chain 52 comprises a total of six scan components i, j, k, l, m, and n, and its staring point 520 and ending point 521 are both at the top level 42, thus forming five cross wires and eight ports between the two planned units 40 and 41.

Figure 7:
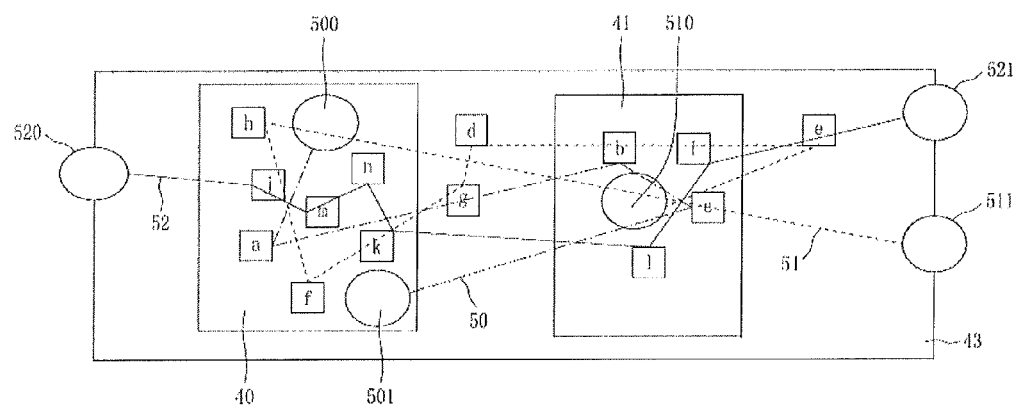
FIG. 7 is a schematic diagram of the scan chain in FIG. 6 after ranking optimization.

If these three scan chains 50, 51, and 52 are resequenced in light of the existing method only, in the scan chain 50, for example, since of all of the scan components in it, a is the one closest to its starting point 500, a is first connected to the starting point 500 of the scan chain 50. Then upon calculation, of b and c, b is the one closer to a, so a and b are connected. Finally b and c, and c and the ending point 501 are connected. In this way, as shown in FIG. 7, said three scan chains 50, 51, and 52 are adjusted such that:

The scan components in the scan chain 50 are a, b, and c in sequence, and there are still two cross wires, and four ports;

The scan components in the scan chain 51 are e, d, g, f, and h in sequence, and there are two cross wires, and three ports;

The scan components in the scan chain 52 are j, m, n, k, l and i in sequence, and there are three cross wires, and four ports.

It can be seen that after simple sequencing, the number of ports and connecting wires between them in the planned units 40 and 41 is somewhat reduced, but there are still many ports and connecting wires and the number can be reduced.

The following is a two-phase reconfiguration of said three scan chains 50, 51, and 52 in accordance with the present invention.

First of all, based on the information of said three scan chains 50, 51, and 52, that is, the scan components and the quantity of them contained in each scan chain, the planned unit where each component is located, and the position of the starting point and ending point of each scan chain, said three scan chains 50, 51, and 52 are classified. Of them, the starting point 500 and ending point 501 of the scan chain 50 are both in the planned unit 40, and therefore it is classified as a first aggregation of scan chains; the starting point 510 and ending point 511 of the scan chain 51 are located respectively in the second planned unit 41 and at the top level 42, and therefore it is classified as a second aggregation of scan chains; and the starting point 520 and ending point 521 of the scan chain 52 are both at the top level 42, and therefore it is classified as a third aggregation of scan chains.

First of all, scan components in the planned unit 40 are selected randomly and assigned to the scan chain 50 in the first aggregation of scan chains, such as a, f, h.

Then, scan components are assigned to the scan chain 51 in the second aggregation of scan chains. Because the ending point 511 of the scan chain 51 is at the top level 42, components b, c, i, and l in the planned unit 41 where the starting point 510 is located are assigned to the scan chain 51. At this time, the scan chain 51 has not been fully filled. Therefore, it is placed in the third aggregation of scan chains.

At this time, there are still two more scan chains 51 and 52 in the third aggregation of scan chains that are yet to be configured, wherein the scan chain 51 needs one scan component, while the scan chain 52 needs six scan components; therefore scan components are selected for the scan chain 52 first. In addition, there are only four available scan components in the planned unit 40 with the greatest number of the available scan components; therefore the available scan components j, k, m, and n in the planned unit 40 and d and e at the top are assigned to the scan chain 52. Finally, the remaining available scan component, that is, g at the top level 42, is selected for the scan chain 51.

Figure 8:
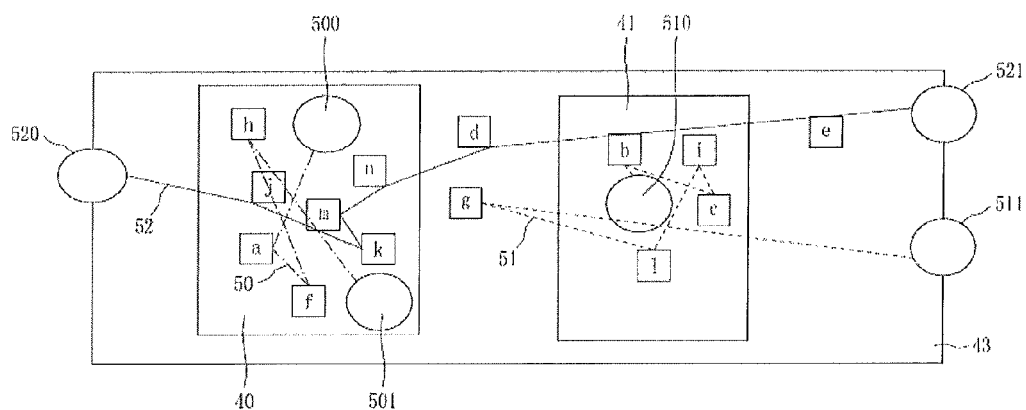
FIG. 8 is a schematic diagram of the scan chain in FIG. 6 after the first phase reconfiguration.

Through reconfiguration of this phase, the composition of each of scan chains 50, 51, and 52 is as shown in FIG. 8, and it can be seen that the ports and connection wires between planned units are reduced to a minimum. Specifically, it is as follows.

The scan components in the scan chain 50 are a, f, and h, and said scan chain 50 does not leave the planned unit; the scan components in the scan chain 51 are b, c, i, l, and g, and there is one cross wire, and one port; the scan components in the scan chain 52 are j, k, m, n, d, and c, and there are two cross wires, and two ports.

Then said number of scan chains can undergo the second phase reconfiguration. Because the scan components in the planned unit 41 are all assigned to the scan chain 51, the said second phase reconfiguration is conducted in the planned unit 40 and at the top level 42 respectively. Said second phase reconfiguration can be conducted using an optimizing method within any single unit or at the top level, such as a ranking method with a penalty parameter taken into consideration. In the present example, only common sequencing by distance is used as an example. In the planned unit 40, m, n, and k are assigned to the scan chain 50, while h, j, a, and f are assigned to the scan chain 51; and at the top level 42, e is assigned to the scan chain 51, while d and g are assigned to the scan chain 52.

Figure 9:
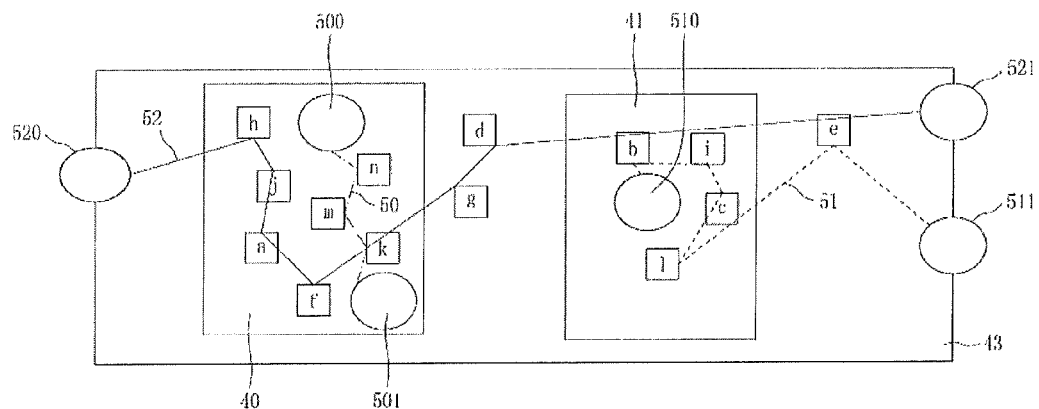
FIG. 9 is a schematic diagram of the scan chain in FIG. 6 after the second phase reconfiguration.

As shown in FIG. 9, the composition of these three scan chain has become [as follows].

The scan chain 50 contains n, m, and k, it is only in the planned unit 40, and the length is reduced; the scan chain 51 contains b, i, c, l, and e, there is one cross wire and one port, and the length is reduced; the scan chain 52 contains h, j, a, f, g, and d, there are two cross wires and two ports, and the length is reduced.

Figure 10:
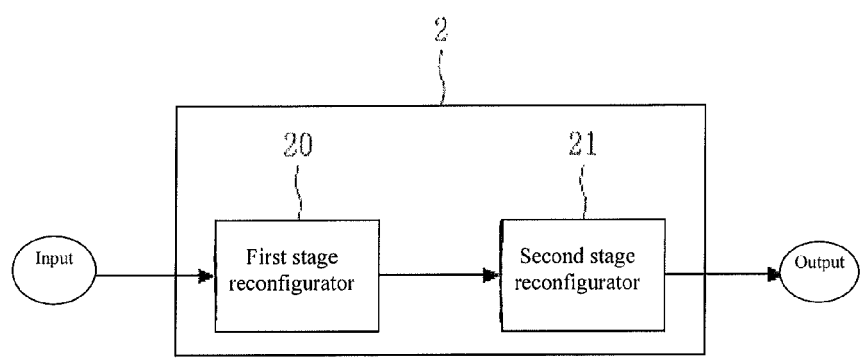
FIG. 10 is a structural block view of the reconfiguration device for scan chains of the present invention.

Corresponding to the reconfiguration method of the present invention, a reconfiguration device 2 for scan chains is provided in the present invention. As shown in FIG. 10, the reconfiguration device 2 of the present invention for scan chains comprises a first stage reconfigurator 20 and a second stage reconfigurator 21.

All of the scan chains are first input to said first stage reconfigurator 20, and during the first phase of the scan chain reconfiguration, primarily based on the quantity of the scan components in the planned units, said first stage reconfigurator 20 lets a scan chain select scan components from the planned unit with the fewest possible scan components. In the process of reconfiguration, said first stage reconfigurator 20 will give adequate consideration to the relationship between the starting point and ending point of the scan chain and the planned unit, so that the scan components in the same planned unit are given priority to be assigned to the scan chain relevant to them, thus properly reducing the number of possible connection wires between the planned units.

After reconfiguration by the first stage reconfigurator 20, the scan chain is input by it to the second stage reconfigurator 21. During the second phase of the scan chain reconfiguration, primarily based on the position information of the scan components, the second stage reconfigurator 21 conducts assignment of scan components within one planned unit to assign the adjacent scan components to the same scan chain, thus reducing the length of wiring between the scan components within each scan chain.

The following is a detailed description of the first stage reconfigurator 20 and second stage reconfigurator 21 of said scan chain reconfiguration device 2, respectively.

Figure 11:
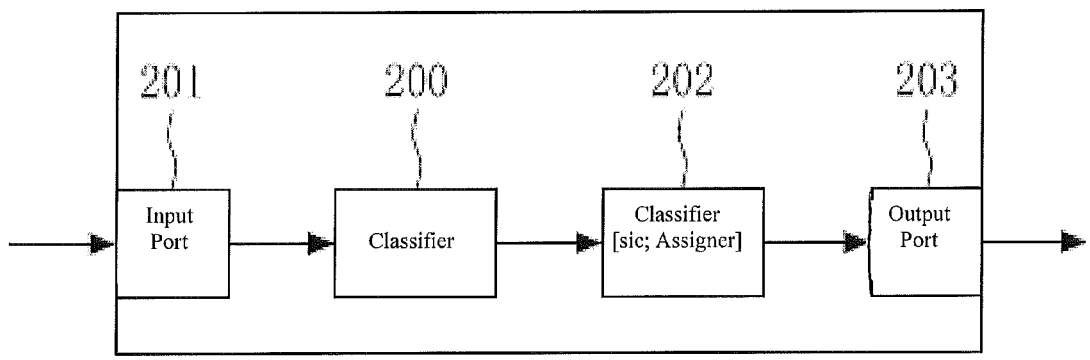
FIG. 11 is a structural block view of the first stage reconfigurator of the present invention.

First stage reconfigurator: The first stage reconfigurator 20 needs to complete the first phase mission of scan chain reconfiguration. The sequence of its reconfiguration is based on the position of the starting point and ending point of each scan chain, so that whenever possible, the scan chain will not go beyond the planned unit where it is located. As shown in FIG. 11, said first stage reconfigurator 20 comprises a classifier 200, to receive through its import port all scan chains and classify them. The scan chains with the starting point and ending point in the same planned unit are classified as a first aggregation of scan chains and components will preferably be selected from the planned unit where they are located; the scan chains with the starting point and the ending point not in the same planned unit are classified as a second aggregation of scan chains, to be treated at a lower priority; and the scan chains with both the starting point and ending point at the top level are classified as a third aggregation of scan chains, to be treated last.

An assigner 202 is communicatively connected to said classifier, and first checks if said first aggregation of scan chains is void, and if there is a scan chain with the starting point and the ending point in the same planned unit, then reconfigures the scan chain with the starting point and the ending point in the same planned unit. Otherwise, it checks if the second aggregation of scan chains is void, and if there is a scan chain with the starting point and the ending point not in the same planned unit, or with only one terminal, that is, a scan chain with the starting point or ending point at the top level, then reconfigures the scan chains in said second aggregation of scan chains. Otherwise, it checks if the third aggregation of scan chains is void, and if it is not, then reconfigures the scan chains in said third aggregation of scan chains, and if it is, then ends said first phase reconfiguration.

Specifically, said assigner 202 first finds the scan chain in the first aggregation of scan chains that requires the fewest scan components, and removes it from the first aggregation of scan chains. It checks if the quantity of the available scan components in a planned unit where the starting point and ending point of said scan chain are located meets the need of said scan chain; if there are enough, it assigns the available scan components in said planned unit to said scan chain in accordance with the quantity that said scan chain requires; otherwise, it assigns all available scan components in said planned unit to said scan chain and places said scan chain in the third aggregation of scan chains.

After reconfiguration of scan chains in the first aggregation of scan chains has been completed, said first stage reconfigurator 20 reconfigures the scan chains in said second aggregation of scan chains. So that the scan chain will go beyond the planned unit as little as possible, similarly, the scan chain that requires the fewest scan components in the second aggregation of scan chains is found, and it is removed from the second aggregation of scan chains. It determines if said scan chain has one terminal (starting point or ending point) at the top level, and if yes, it then determines if the quantity of the scan components in the planned unit where the other end (ending point or starting point) is located meets the demand of said scan chain. If there are sufficient scan components in said planned unit, it then assigns the scan components in said planned unit to said scan chain based on the quantity demanded; otherwise, it assigns the scan components in said planned unit to said scan chain and places it in the third aggregation of scan chains. Otherwise, [if] the starting point and the ending point of said scan chain are in two different planned units, then, for meet demand planned units, it calculates respectively the total demand of all of the scan chains from which scan components may be selected for scan components. It determines if the available scan components in meet demand planned units meet the requirement of said scan chain, and if yes, it then selects scan components preferably from a planned unit where the total demand for the scan components is less and assigns them to said scan chain, and selects scan components from another planned unit for deficiencies; otherwise, it assigns the available scan components in meet demand planned units to said scan chain and places said scan chain in the third aggregation of scan chains.

When the second aggregation of scan chains is found to be void, said first stage reconfigurator 20 reconfigures the scan chains with the starting point and the ending point both at the top level and completes [reconfiguration of] the scan chains the reconfiguration of which was not completed previously. The assigner 202 removes the scan chain requiring the greatest number of scan components from said third aggregation of scan chains in the classifier 200. It checks if there is a planned unit containing more available scan components than the quantity of scan components required by the scan chain with the greatest demand. If yes, said scan chain is selected from the planned unit with the fewest scan components; Otherwise, the selection of said scan chain begins from the planned unit containing the greatest number of available scan components, and finally from the top level, thus avoiding dividing the planned unit by even more scan chains, and reducing the number of ports on said planned unit.

The second phase reconfiguration: After reconfiguration by the first stage reconfigurator 20 has been completed, the result is transferred through the output port 203 to the second stage reconfigurator 21. Because during the first phase reconfiguration of the scan chain, the scan components in the planned unit are selected randomly and assigned to the scan chain, it is possible that a selected scan component may be far from it, while a component very close to it may not be selected. Therefore, the scan components in the same planned unit required by the scan chain will be re-assigned by the second stage reconfigurator 21 based on the positions of the scan components. Of them, adjacent scan components that are close to a scan chain will be assigned to said scan chain, thus reducing the total length of wiring among scan components in said scan chain.

A comparison with the technical plan of the existing technology where only reduction of the length of the scan chain is taken into consideration shows that with the present invention of a reconfiguration method and device for scan chains, during the first phase reconfiguration, the scan chains will be classified based on the position of the terminals, so that the scan chains go through as few planned units as possible, thus reducing by a large margin ports on the planned units and the connection wires between planned units, and reducing the demand for resources and the difficulty in the subsequent design. The present invention is also capable of second phase reconfiguration after the first phase, wherein the scan components required by the scan chains in the same planned unit are reassigned based on their positions, thus further reducing the length of the scan chain.

The technical content and technical features of the present invention have been disclosed above, but technical personnel who are familiar with the present field, based on the instruction and disclosure of the present invention, can implement various replacements and modifications without deviating from the spirit of the present invention. Therefore, the scope of the claims of the present invention should not be restricted to the content disclosed in the examples, but should include various replacements and modification that do not deviate from the present invention, and that are covered by the claims of the present invention.

The invention claimed is:

1. A reconfiguration method of scan chains comprising:
classifying, using a computer, a number of scan chains, wherein scan chains with a starting point and an ending point in a same planned unit are classified as a first aggregation of scan chains, scan chains with the starting point and the ending point not in the same planned unit are classified as a second aggregation of scan chains and scan chains with the starting point and the ending point at a same top level are classified as a third aggregation of scan chains;
reconfiguring the scan chains in the first aggregation of scan chains until the first aggregation of scan chains is void;
removing the scan chain requiring a fewest scan components from the first aggregation of scan chains;
assigning the available scan components in a planned unit where a terminal of the scan chain is located to the scan chain based on a quantity that the scan chain requires if a quantity of available scan components in the planned unit meets a need of the scan chain;
assigning all available scan components in the planned unit to the scan chain and placing the scan chain in the third aggregation of scan chains if the quantity of available scan components in the planned unit does not meet the need of the scan chain;
reconfiguring the scan chains in the second aggregation of scan chains until the second aggregation of scan chains is void;
reconfiguring the scan chains in the third aggregation of scan chains until the third aggregation of scan chains is void; and
reassigning scan components required by the scan chains in the same planned unit based on positions of the scan components during the second phase reconfiguration.

2. The reconfiguration method of scan chains as described in claim 1 further comprising:
removing the scan chain requiring the fewest scan components from the second aggregation of scan chains;
determining if the quantity of the available scan components in the planned unit where the other terminal of the scan chain is located meets the requirement of the scan chain if the scan chain has a terminal at the top level;
for two planned units where the two terminals of the scan chain are located, calculating respectively a total demand of all of the scan chains from which scan components may be selected for scan components if the scan chain does not have the terminal at the top level.

3. The reconfiguration method of scan chains as described in claim 2 further comprising:
assigning the scan components in the planned unit to the scan chain based on the quantity that the scan chain requires if the quantity of the scan components in the planned unit is sufficient; and assigning the scan components in the planned unit to the scan chain and adding the scan chain to the third aggregation of scan chains if the quantity of scan components in the planned unit is not sufficient.

4. The reconfiguration method of scan chains as described in claim 2 further comprising:

if the available scan components in meet demand planned units meet the requirement of the scan chain, selecting scan components from a planned unit where the total demand for the scan components is less, assigning the scan components to the scan chain, and selecting scan components from another planned unit for deficiencies; and if the available scan components in meet demand planned units do not meet the requirement, assigning all available scan components in meet demand planned units to the scan chain, and placing the scan chain in the third aggregation of scan chains.

5. The reconfiguration method of scan chains as described in claim 1 further comprising:

removing the scan chain requiring the greatest number of scan components from the third aggregation of scan chains;

selecting the scan chain from the planned unit with the fewest scan components if there is a planned unit containing more available scan components than the number of scan components required by the scan chain with the greatest demand; and assigning scan components to the scan chain from the planned unit containing the greatest number of available scan components and selecting scan components from the top level if there is not the planned unit containing more available scan components than the number of scan components required by the scan chain with the greatest demand.

6. The reconfiguration method of scan chains as described in claim 1, wherein adjacent scan components that are close to a scan chain will be assigned to the scan chain.

7. A reconfiguration device of scan chains, comprising:

a first stage reconfigurator comprising:

a classifier configured to classify scan chains with a starting point and an ending point in a same planned unit as a first aggregation of scan chains, scan chains with the starting point and the ending point not in the same planned unit as a second aggregation of scan chains and scan chains with the starting point and the ending point at a same top level as a third aggregation of scan chains; and an assigner communicatively connected to the classifier and configured to:

reconfigure the scan chains in each of the first aggregation, the second aggregation and the third aggregation of scan chains until the first aggregation, the second aggregation and the third aggregation of scan chains are respectively void;

remove the scan chain requiring the fewest scan components from the first aggregation of scan chains;

assign the available scan components in a planned unit where the terminal of the scan chain is located to the scan chain based on the quantity that the scan chain requires if a quantity of the available scan components in a planned unit meets a need of the scan chain; and assign all available scan components in the planned unit to the scan chain and place the scan chain in the third aggregation of scan chains if the quantity does not meet the need; and a second stage reconfigurator communicatively connected to the first stage reconfigurator and configured to re-assign the scan components required by the scan chains in the same planned unit based on the positions of the scan components for the scan chain reconfigured by the first stage reconfigurator.

8. The reconfiguration device of scan chains as described in claim 7, wherein the assigner is further configured to:

remove the scan chain requiring a fewest scan components from the second aggregation of scan chains;

determine if the quantity of the available scan components in the planned unit where the other terminal of the scan chain is located meets the requirement of the scan chain if the scan chain has a terminal at the top level; and if the scan chain does not have the terminal at the top level, for the two planned units where the two terminals of the scan chain are located, calculate a total of a demand of all of the scan chains from which scan components may be selected respectively.

9. The reconfiguration device of scan chains as described in claim 8, wherein the assigner is further configured to:

assign the scan components in the planned unit to the scan chain based on the quantity that the scan chain requires if the quantity of the scan components in the scan chain is sufficient; and assign the scan components in the planned unit to the scan chain and add the scan chain to the third aggregation of scan chains if the quantity is not sufficient.

10. The reconfiguration device of scan chains as described in claim 8, wherein if the scan chain does not have any terminal on the top level, the assigner is further configured to:

select scan components from a planned unit where the total demand for the scan components is less, assign them to the scan chain and select scan components from another planned unit for deficiencies if the available scan components in meet demand planned units meet the requirement of the scan chain; and assign all available scan components in meet demand planned units to the scan chain and place the scan chain in the third aggregation of scan chains if the available scan components in meet demand planned units do not meet the requirement of the scan chain.

11. The reconfiguration device of scan chains as described in claim 7, wherein the assignor is further configured to:

remove the scan chain requiring a greatest number of scan components from the third aggregation of scan chains;

select the scan chain with the fewest scan components from the planned unit if there is a planned unit containing more available scan components than the number of scan components required by the scan chain with the greatest demand; and assign scan components to the scan chain from the planned unit containing the greatest number of available scan components and select scan components from the top level if there is not the planned unit containing more available scan components than the number of scan components required by the scan chain with the greatest demand.

12. The reconfiguration device of scan chains as described in claim 7, wherein the second stage reconfigurator is further configured to assign the adjacent scan component that is close to a scan chain to the scan chain.

* * * * *